United States Patent [19]

Lodhi

[11] Patent Number: 4,995,005

[45] Date of Patent: Feb. 19, 1991

[54] MEMORY DEVICE WHICH CAN FUNCTION AS TWO SEPARATE MEMORIES OR A SINGLE MEMORY

[75] Inventor: Nusra Lodhi, Sunnyvale, Calif.

[73] Assignee: Advanced Micro Devices, Inc., Sunnyvale, Calif.

[21] Appl. No.: 413,507

[22] Filed: Sep. 26, 1989

Related U.S. Application Data

[62] Division of Ser. No. 373,743, Jun. 29, 1989, which is a division of Ser. No. 908,559, Sep. 18, 1986, Pat. No. 4,847,812.

[51] Int. Cl.⁵ .................. G11C 7/00; G11C 19/00; G11C 8/00
[52] U.S. Cl. ................. 365/221; 365/78; 365/230.02; 365/239; 365/189.02; 365/230.04
[58] Field of Search .......... 365/189.04, 189.05, 365/221, 239, 230.04, 189.02, 236, 230.02, 78

[56] References Cited

U.S. PATENT DOCUMENTS

| | | | |
|---|---|---|---|
| 3,553,651 | 1/1971 | Bird et al. | 340/172.5 |
| 3,629,857 | 12/1971 | Faber | 340/172.5 |
| 4,062,059 | 12/1977 | Suzuki et al. | 364/200 |
| 4,093,995 | 6/1978 | Smith et al. | 364/900 |
| 4,125,870 | 11/1978 | Suzuki et al. | 364/900 |
| 4,138,732 | 2/1979 | Suzuki et al. | 364/900 |
| 4,145,755 | 3/1979 | Suzuki et al. | 364/900 |
| 4,161,778 | 7/1979 | Getson, Jr. et al. | 364/200 |
| 4,163,291 | 7/1979 | Suzuki et al. | 365/221 |
| 4,236,225 | 11/1980 | Jansen et al. | 364/900 |
| 4,258,418 | 3/1981 | Heath | 364/200 |
| 4,270,183 | 5/1981 | Robinson et al. | 364/900 |
| 4,271,480 | 6/1981 | Vinot | 364/900 |
| 4,285,038 | 8/1981 | Suzuki et al. | 364/200 |
| 4,342,081 | 7/1982 | Dubuc | 364/200 |
| 4,344,132 | 8/1982 | Dixon et al. | 364/200 X |
| 4,377,843 | 3/1983 | Garringer et al. | 364/200 X |
| 4,433,394 | 2/1984 | Torii et al. | 365/221 |
| 4,476,542 | 10/1984 | Crean et al. | 364/900 |
| 4,486,854 | 12/1984 | Yuni | 364/900 |
| 4,493,053 | 1/1985 | Thompson | 364/900 X |
| 4,507,760 | 3/1985 | Fraser | 365/221 |
| 4,521,874 | 6/1985 | Rau et al. | 365/221 |
| 4,527,233 | 7/1985 | Ambrosius, III et al. | 364/200 |
| 4,535,427 | 8/1985 | Jiang | 365/205 |
| 4,694,426 | 9/1987 | Mason | 365/78 X |
| 4,804,161 | 2/1989 | Torii et al. | 365/221 |
| 4,833,651 | 5/1989 | Seltzer et al. | 365/230.05 |
| 4,833,655 | 5/1989 | Wolf et al. | 365/73 |
| 4,839,866 | 6/1989 | Ward et al. | 365/221 X |

OTHER PUBLICATIONS

"8257/8257-5 Programmable DMA Controller", published by Intel Corporation, 1979, pp. 1-73 to 1-89.
Data sheet entitled "FIFO RAM Controller", (Part No. 57/674219), published by Monolithic Memories, Inc., in 1986.
Electronic Design, Jun. 11, 1987, pp. 77-86, Electronic Design Report, "Rich w/logic, Memory ICs Have Their Specialties", by Tunick.
System Design/Memory Systems, Computer Design, Aug. 1, 1986, pp. 109-112, "FIFO RAM Controller Tackles Deep Data Buffering", by Tom Pai.

Primary Examiner—Glenn Gossage
Assistant Examiner—Alfonso Garcia
Attorney, Agent, or Firm—Skjerven, Morrill, MacPherson, Franklin & Friel

[57] ABSTRACT

A FIFO memory device facilitates transfer of data between a host CPU and a peripheral device in one of a number of modes. In one mode, the FIFO memory device functions as two FIFO memories, one for passing data from the host CPU to the peripheral device, and one for passing data to the host CPU from the peripheral device. In another mode, the FIFO memory device functions as a single FIFO which facilitates passing data from the host CPU to the peripheral device or from the peripheral device to the host CPU. The FIFO incloudes two RAMs addressed by a set of address counters. Of importance, the host CPU can bypass the address counters to directly address each RAM, thereby reading data from or writing data into either RAM regardless of the state of the address counters.

8 Claims, 7 Drawing Sheets

MEMORY DEVICE WHICH CAN FUNCTION AS TWO SEPARATE MEMORIES OR A SINGLE MEMORY

This application is a division of application of Ser. No. 07/373,743, filed June 29, 1989, which is a division of application Ser. No. 06/908,559, filed Sept. 18, 1986, now U.S. Pat. No. 4,847,812.

BACKGROUND OF THE INVENTION

This invention relates to first-in-first-out (FIFO) memory devices and more specifically to FIFO memories which facilitate data communication between a host CPU and a peripheral device.

It is known in the art to use FIFO memories to facilitate data communication between a host CPU and a peripheral device. For example, U.S. Pat. No. 4,145,755 issued to Suzuki et al. discusses a system in which a CPU loads a FIFO memory with data. After the FIFO memory is filled with data, the data in the FIFO memory is transferred to a peripheral device. The Suzuki FIFO memory device provides flag signals to the host CPU indicating when the FIFO memory is full or empty. The system discussed in the '755 patent is relatively simple and only allows for data to be transferred from the host CPU to the peripheral device.

A more complicated system is discussed in U.S. Pat. No. 4,138,732 also issued to Suzuki et al. Illustrated as prior art in FIG. 1 of the '732 patent is a system employing two FIFO memories, one which facilitates communication of data from a host CPU to a peripheral device and a second FIFO memory which facilitates communication of data from the peripheral device to the host CPU.

Another type of FIFO memory is illustrated in FIG. 2 of the '732 patent. The FIFO memory of FIG. 2 includes a RAM which is addressed by a first up-down counter during transfer of data between a host CPU and the RAM. The contents of the first up-down counter can be preset to any desired value by the host CPU. Similarly, the RAM is also addressed by a second up-down counter during transfer of data between a peripheral device and the RAM. The second up-down counter can be preset to any desired value by the peripheral device. The FIF0 memory can pass information from the host CPU to the peripheral device or from the peripheral device to the host CPU.

SUMMARY

A FIFO memory device constructed in accordance with my invention facilitates communication of data between a host CPU and a peripheral device. The FIFO memory device includes first and second RAMs which can be configured to function in a number of modes in response to commands from the host CPU. For example, in a first mode, the first RAM serves as a FIFO memory which receives data from the host CPU and provides that data on a first-in-first-out basis to the peripheral device while the second RAM receives data from the peripheral device and provides that data on a first-in-first-out basis to the host CPU. In accordance with one feature of my invention, the host CPU can selectively address any desired location within either the first or second RAM and either read data from or write data to that location. In this way, the host CPU can write data to or retrieve data from the FIFO memory device without having to wait for location pointers within the FIFO memory device to reach a desired address.

The first and second RAMs can also be configured to act as a single FIFO memory device to either pass data from the host CPU to the peripheral device or pass data from the peripheral device to the host CPU.

In another mode, the FIFO memory can be commanded by the host CPU to provide data stored in a specific block of addresses from the first RAM to the peripheral device or load data from the peripheral device into a specific block of addresses in the second RAM. In addition, the FIFO memory can be programmed to store data from the host CPU into a specific block of addresses within the first RAM or provide data from a specific block of addresses within the B second RAM to the host CPU. The FIFO memory can also be commanded to function in a number of modes which are variations of the above-described modes. It will be appreciated therefore that the FIFO memory device of the present invention can be used in a large number of applications to fulfill a variety of requirements.

In one embodiment, the first and second RAMs are each organized into columns and rows of addresses, and are each addressed by an associated pair of counters. The first counter within the pair is a binary counter which selects a column while the second counter selects a row. The RAMs are typically large, e.g., 8 columns and 128 rows for a total of 1,024 locations.

In a first alternative embodiment, instead of using binary counters to select a row and a column within each RAM, a first ring counter is used to select a row within each RAM and a second ring counter is used to select a column within each RAM. In a second alternative embodiment, instead of using a single ring counter to select a row, a plurality of ring counters is used to select a row.

For example, in one embodiment, three four bit ring counters and a two bit ring counter are used to select one of the 128 rows. Because the surface area of an integrated circuit including the four ring counters is smaller than the surface area used to provide a 128-bit ring counter, the FIFO memory of the present invention is less expensive to manufacture than a device using a single 128-bit ring counter.

BRIEF DESCRIPTION OF THE DRAWINGS

FIGS. 1a and 1b are block diagrams of a FIFO memory device constructed in accordance with one embodiment of the present invention.

FIG. 1 illustrates the manner in which FIGS. 1a and 1b are to be placed relative to one another.

FIGS. 4a and 4b detailed schematic diagrams of counter 24w of FIG. 3.

FIG. 4 illustrates the manner in which FIGS. 4a and 4b are to be placed relative to one another.

DETAILED DESCRIPTION

Figures 1, 1A:
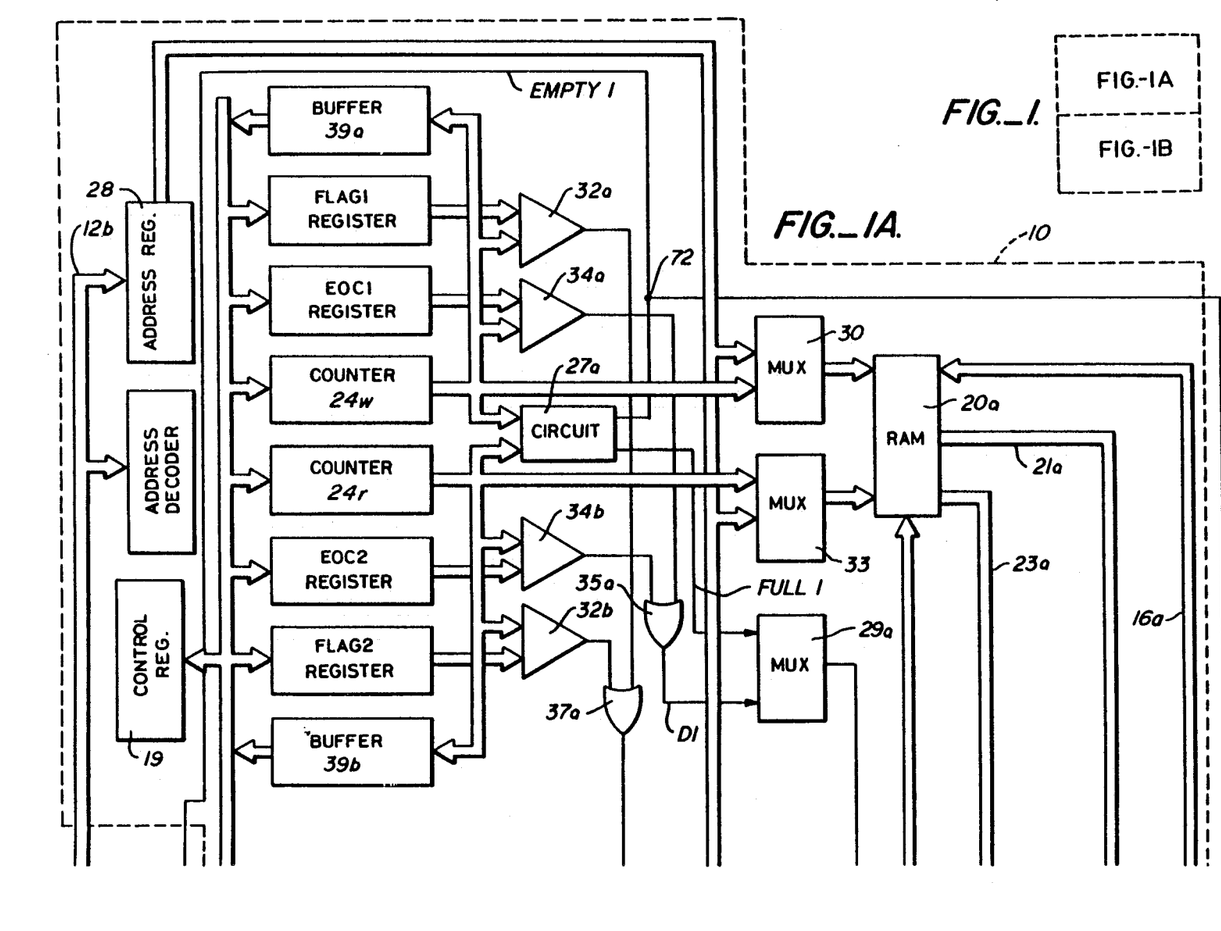
Figure 1B:
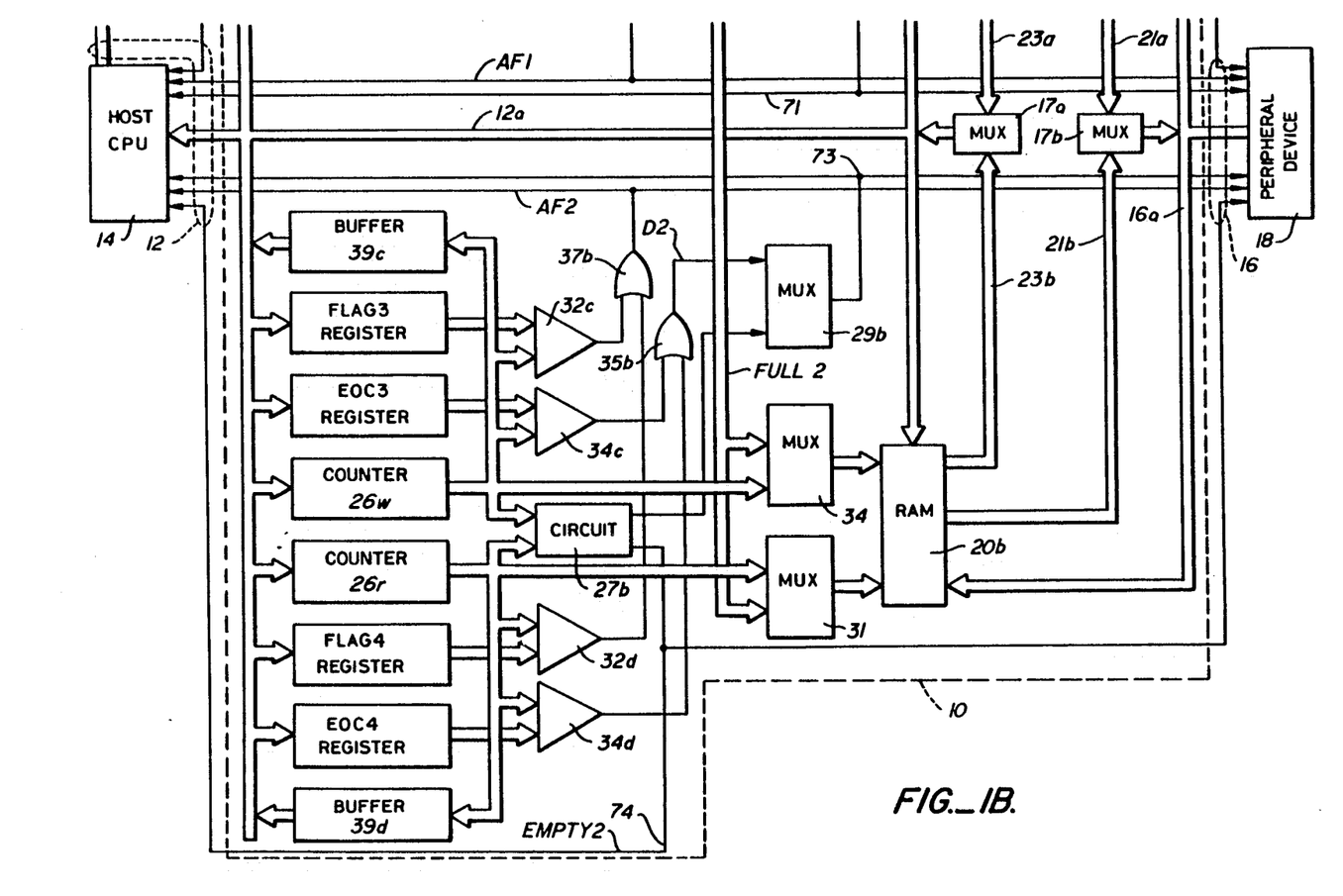

FIGS. 1a and 1b are block diagrams of a FIFO memory device 10 constructed in accordance with one embodiment of my invention. Memory device 10 includes a first port 12 for transferring data between memory device 10 and a host CPU 14. As will be discussed in detail below, device 10 includes a bidirectional data bus 12a and an address bus 12b coupled to port 12. Host CPU 14 can be any of a number of devices, e.g. a conventional microprocessor. Memory device 10 also includes a port 16 for communicating with a device 18. Device 18 can be any of a number of devices, e.g. a peripheral device such as a magnetic disk or any other digital device capable of transferring data.

During operation, memory device 10 facilitates communication of data between host CPU 14 and device 18. Memory device 10 can operate in any of a number of modes. In a first set of modes, data is provided by host CPU 14 to memory device 10 which is then read by device 18. Similarly, device 18 also provides data to memory device 10 which is read by host CPU 14. In a second set of modes, data transfer is only in a single direction, i.e. from host CPU 14 to device 18 via memory device 10 or from device 18 to host CPU 14 via memory device 10. These modes are discussed in detail below. Host CPU 14 selects the mode that memory device 10 operates in by writing a word of data into a control register 19 within device 10, as will be discussed in detail below.

DUAL FIFO MODE

Memory device 10 includes first and second dual port RAMs 20a and 20b. In one embodiment, RAMs 20a and 20b each store 1,024 words of data, each word including 9 bits. (The ninth bit of each word in RAMS 20a and 20b is typically used as a parity bit.) During the dual FIFO mode, RAM 20a serves as a first FIFO memory which receives words of data from host CPU 14 via data bus 12a and provides those words on a first-in-first-out basis to device 18 via an output bus 21a, a multiplexer 17b and a data bus 16a coupled to port 16. Concurrently, RAM 20b acts as a second FIFO memory which receives words of data from device 18 via data bus 16a provides those words on a first-in-first-out basis to host CPU 14 via a bus 23b, a multiplexer 17a, and data bus 12a.

During the dual FIFO mode, when host CPU 14 writes data to RAM 20a, RAM 20a is addressed by a write counter 24w via a multiplexer 30. Each time a word is transferred from host CPU 14 to dual port RAM 20a, write counter 24w increments. In this way, successive words of data from host CPU 14 are loaded into successive locations within RAM 20a. Similarly, when device 18 reads data from dual port RAM 20a, RAM 20a is addressed by a read counter 24r via a multiplexer 33. As words of data are read from RAM 20a by device 18, read counter 24r increments. Device 18 therefore reads data stored in successive locations of dual port RAM 20a. In this way, RAM 20a provides data from host CPU 14 to device 18 on a first-in-first-out basis.

As mentioned above, in dual FIFO mode, dual port RAM 20b also acts as a FIFO memory which receives data from device 18. When receiving data from device 18, dual port RAM 20b is addressed by a write counter 26w via a multiplexer 34. Each time a word of data is transferred from device 18 to dual port RAM 20b, write counter 26w increments. When host CPU 14 receives data from dual port RAM 20b, dual port RAM 20b is addressed by a read counter 26r via a multiplexer 31. Each time host CPU 14 receives a word of data from device 10, read counter 26r increments. In this way, host CPU 14 receives data from successive locations in dual port RAM 20b.

In accordance with one feature of my invention, dual port RAM 20a can also be addressed directly by host CPU 14. To do this, host CPU 14 stores a desired address in an address register 28 (via address bus 12b) which addresses RAM 20a via multiplexer 30 during write operations and via multiplexer 33 during read operations. Thus, host CPU 14 can directly access any location in dual port RAM 20a and either read data from or write data to that location regardless of the contents of counters 24r and 24w. The contents of address register 28 can also be used to address any location within dual port RAM 20b via multiplexer 31 during read operations and via multiplexer 34 during write operations. Host CPU 14 can therefore write data to or receive data from any location in dual port RAM 20b, regardless of the order in which that data was written. Therefore, if it is desired to read data from or write data to a specific location in RAM 20a or 20b, it is not necessary to wait for counter 24w, 24r, 26w, or 26r to increment to that address.

Memory device 10 includes circuit 27a which compares the contents of read counter 24r and write counter 24w and provides output signals FULL1 and EMPTY1 when RAM 20a is full and empty, respectively. Signal FULL1 is provided to host CPU 14 and peripheral device 18 via a multiplexer 29a and a lead 71. Signal EMPTY1 is provided to host CPU 14 and peripheral device 18 via a lead 72. If host CPU 14 performs 1,024 more write operations than the number of read operations performed by peripheral device 18, signal FULL1 goes active (high). Host CPU 14 typically responds to signal FULL1 by ceasing further write operations until signal FULL1 goes low. Similarly, when the number of write operations performed by host CPU 14 equals the number of read operations performed by peripheral device 18, signal EMPTY1 goes active. Peripheral device 18 typically responds to signal EMPTY1 by ceasing further read operations until signal EMPTY1 goes low. Signals FULL2 and EMPTY2 provide similar information regarding the status of RAM 20b. Signal FULL2 is provided by a circuit 27b via a multiple 29b and a lead 73. Signal EMPTY2 is provided by circuit 27b to host CPU 14 and peripheral device 18 via a lead 74.

SINGLE FIFO MODE A

In single FIFO mode A, RAMs 20a and 20b are configured to function as a single 2,048 word FIFO memory device. In this mode, data from host CPU 14 is written into successive locations of dual port RAM 20a via data bus 12a. When receiving data from host CPU 14, dual port RAM 20a is addressed by write counter 24w. After the last location of dual port RAM 20a is loaded with data from host CPU 14, the next word of data from host CPU 14 is loaded into the first location of dual port RAM 20b, which is addressed by write counter 26w. Successive words of data from host CPU 14 are thereafter loaded into successive locations in dual port RAM 20b. After the last location of dual port RAM 20b is loaded with data from host CPU 14, the next word of data from host CPU 14 is stored in the first location of dual port RAM 20a. Similarly, device 18 receives words of data stored in successive locations within dual port RAM 20a. When providing data to device 18, dual port RAM 20a is addressed by read counter 24r. After data from the last location of dual port RAM 20a is read by device 18, upon the next request for data by device 18, the word of data located in the first location of dual port RAM 20b is provided to device 18. When providing data to device 18, dual port RAM 20b is addressed by read counter 26r. In this way, dual port RAMs 20a and 20b function as a single 2K × 9 FIFO memory which receives data from host CPU 14 and provides that data to device 18.

As in the previously described dual FIFO mode, during single FIFO mode A, memory device 10 provides signals FULL1, EMPTY1, FULL2 and EMPTY2 when RAM 20a is full, when RAM 20a is empty, when RAM 20b is full, and when RAM 20b is empty, respectively. Signals FULL1, EMPTY1, FULL2 and EMPTY2 are received by host CPU 14 and processed in a manner dependent on the program being executed by host CPU 14.

Of importance, during single FIFO mode A, host CPU 14 can access any location in either RAM 20a or RAM 20b to either read data or write data. This is done by storing an address in address register 28 as described above.

SINGLE FIFO MODE B

Single FIFO mode B is identical to single FIFO mode A, except memory device 10 receives data from device 18 and provides that data on a first-in-first-out basis to host CPU 14. When receiving data from device 18, RAMs 20a and 20b are addressed by write counters 24w and 26w, respectively. When providing data to host CPU 14, RAMs 20a and 20b are addressed by read counters 24r and 26r, respectively. During this mode, as in all other modes, host CPU 14 can access any location in RAM 20a or 20b and either read from or write data to that location.

DMA MODE

When functioning in either dual FIFO mode, single FIFO mode A or single FIFO mode B, either port 12 or port 16 or both ports 12 and 16 can function in DMA mode. The DMA mode can best be understood by example. In this example, device 10 is in the dual FIFO mode, host CPU 14 determines that port 16 is in the DMA mode, and device 18 transfers a predetermined number of words to memory device 10. These words are stored in a predetermined block of addresses within RAM 20b. Host CPU 14 determines that the first word of data from device 18 will be stored, for example, at location 20 within RAM 20b and the last word will be at location 39 in RAM 29b. Host CPU 14 loads the value 20 in counter 26w and the value 39 in a register EOC3. In addition, in this example, host CPU 14 programs device 10 to provide an output signal AF2 to host CPU 14 and device 18 to indicate when 15 words of data have been stored in RAM 20b by device 18. Accordingly, host CPU 14 loads the value 35 (20+15) into a register FLAG3. As successive words of data are loaded into RAM 20b by device 18, the contents of counter 26w increment. When the contents of counter 26w equal 35, the output signal of a comparator 32c goes high, causing an OR gate 37b to provide output signal AF2 to host CPU 14 and device 18. When the contents of counter 26w equal the contents of register EOC3, the output signal of a comparator 34c goes high, causing an OR gate 35b to provide a signal D2 to host CPU 14 and device 18 via multiplexer 29b and lead 73, indicating that the DMA transfer of data is complete. Of importance, when signal D2 is high, further DMA transfer of data from device 18 to RAM 20b is disabled until new data is written into register EOC3 or counter 26w, or device 10 is programmed to take port 16 out of the DMA mode.

It will be appreciated by those skilled in the art that locations 20, 35, and 39 are merely exemplary and that other addresses can be selected by host CPU 14.

Device 10 also includes registers EOC1, EOC2, EOC4 FLAG1, FLAG2 and FLAG4, which are also used during DMA operations. These registers function as indicated below.

TABLE I

| Register | Function |
|---|---|
| EOC1: | Holds the address for the last word of data to be written by host CPU 14 to RAM 20a during DMA mode. When the contents of register EOC1 equal the contents 24w, OR gate 35a provides output signal D1 to host CPU 14 and device 18 via multiplexer 29a. |
| FLAG1: | When the contents of counter 24w equal the contents of register FLAG1, device 10 provides flag signal AF1 to host CPU 14 and device 18. |
| EOC2: | Holds the address for the last word of data to be read from RAM 20a during DMA mode. When the contents of register EOC2 equal the contents of counter 24r, OR gate 35a provides signal D1 to host CPU 14 and device 18 via multiplexer 29a. |
| FLAG2: | When the contents of counter 24r equal the contents of register FLAG2, device 10 provides flag signal AF1 to host CPU 14 and device 18. |
| EOC3: | Holds the address for last word of data to be written to RAM 20b during DMA mode. When the contents of counter 26w equal the contents of register EOC3, OR gate 35b provides signal D2 to host CPU 14 and device 18 via multiplexer 29b. |
| FLAG3: | When contents of counter 26w equal the contents of register FLAG3, device 10 provides flag signal AF2 to device 18 and host CPU 14. |
| EOC4: | Holds the address of last word of data to be read from RAM 20b during DMA mode. When the contents of counter 26r equal the contents of register EOC4, OR gate 35b provides signal D2 to host CPU 14 and device 18 via multiplexer 29b. |
| FLAG4: | When the contents of counter 26r equal the contents of register FLAG4, device 10 provides flag signal AF2 to host CPU 14. |

The above-described registers and counters are mapped into locations 0 to 23 of the memory address space of host CPU 14. As mentioned above, device 10 includes a 12-bit address bus 12b which receives addresses from host CPU 14. Of importance, an address line A11 of bus 12b indicates to device 10 whether host CPU 14 is attempting to access one of the registers listed in TABLE I or a location within one of RAMs 20a and 20b.

Since RAMs 20a and 20b each include 1024 locations for a total of 2,048 locations, a 10-bit address is required to select a location in RAMs 20a and 20b. Although data bus 12a transmits 9 bits of data between host CPU 14 and RAMs 20a and 20b, as mentioned above, the ninth bit of bus 12a typically transmits a parity signal. This ninth bit of bus 12a is therefore not received by the registers listed in TABLE I.

Since the registers of TABLE I are 10 bits wide but receive only eight bits of information from data bus 12a, each register FLAG1 to FLAG4, EOC1 to EOC4, and counters 24r, 24w, 26r and 26w are each mapped into two locations as indicated below, one location for receiving the lower eight bits and one location for receiving the higher two bits.

TABLE II

| Register/Counter | Address | Type of Access |
|---|---|---|
| Counter 24w | 0 and 1 | read and write |
| Counter 26w | 2 and 3 | read and write |
| Counter 24r | 4 and 5 | read and write |
| Counter 26r | 6 and 7 | read and write |
| EOC1 | 8 and 9 | write only |
| EOC2 | 10 and 11 | write only |
| EOC3 | 12 and 13 | write only |
| EOC4 | 14 and 15 | write only |
| FLAG1 | 16 and 17 | write only |
| FLAG2 | 18 and 19 | write only |
| FLAG3 | 20 and 21 | write only |
| FLAG4 | 22 and 23 | write only |
| Control Register 19 | 24 | write only |

The contents of counters 24w, 24r, 26w and 26r can be read by host CPU 14 via buffers 39a, 39b, 39c, and 39d, respectively, by way of data bus 12a.

Control register 19 controls the mode of operation for device 10. The bit definition for control register 19 is as follows:

TABLE III

| Bit | State | |
|---|---|---|
| 1 | 0 | dual FIFO mode |
|   | 1 | single FIFO mode |
| 2 | 0 | device 10 not cascaded or device 10 is the first FIFO device in a set of cascaded memory devices (described below) |
|   | 1 | device 10 cascaded (also described below) |
| 3 | 0 | device 10 does not function in DMA mode |
|   | 1 | device 10 functions in DMA mode |
| 4 | 0 | data is transferred from port 12 to port 16 when device 10 functions as a single FIFO memory |
|   | 1 | data is transferred from port 16 to port 12 when device 10 functions as a single FIFO memory |
| 5 | 0 | signal D1 is enabled |
|   | 1 | signal D1 is disabled |
| 6 | 0 | signal D2 is enabled |
|   | 1 | signal D2 is disabled |
| 7 | 0 | reset 1 disable |
|   | 1 | reset FIFO 1, i.e., counters 24w, 24r, and registers FLAG1, FLAG2, EOC1, EOC2 set to zero |
| 8 | 0 | reset 2 disable |
|   | 1 | reset FIFO 2, i.e. set counters 26w, 26r and registers FLAG3, FLAG4, EOC3 and EOC4 to zero |

CASCADING

Figure 2:
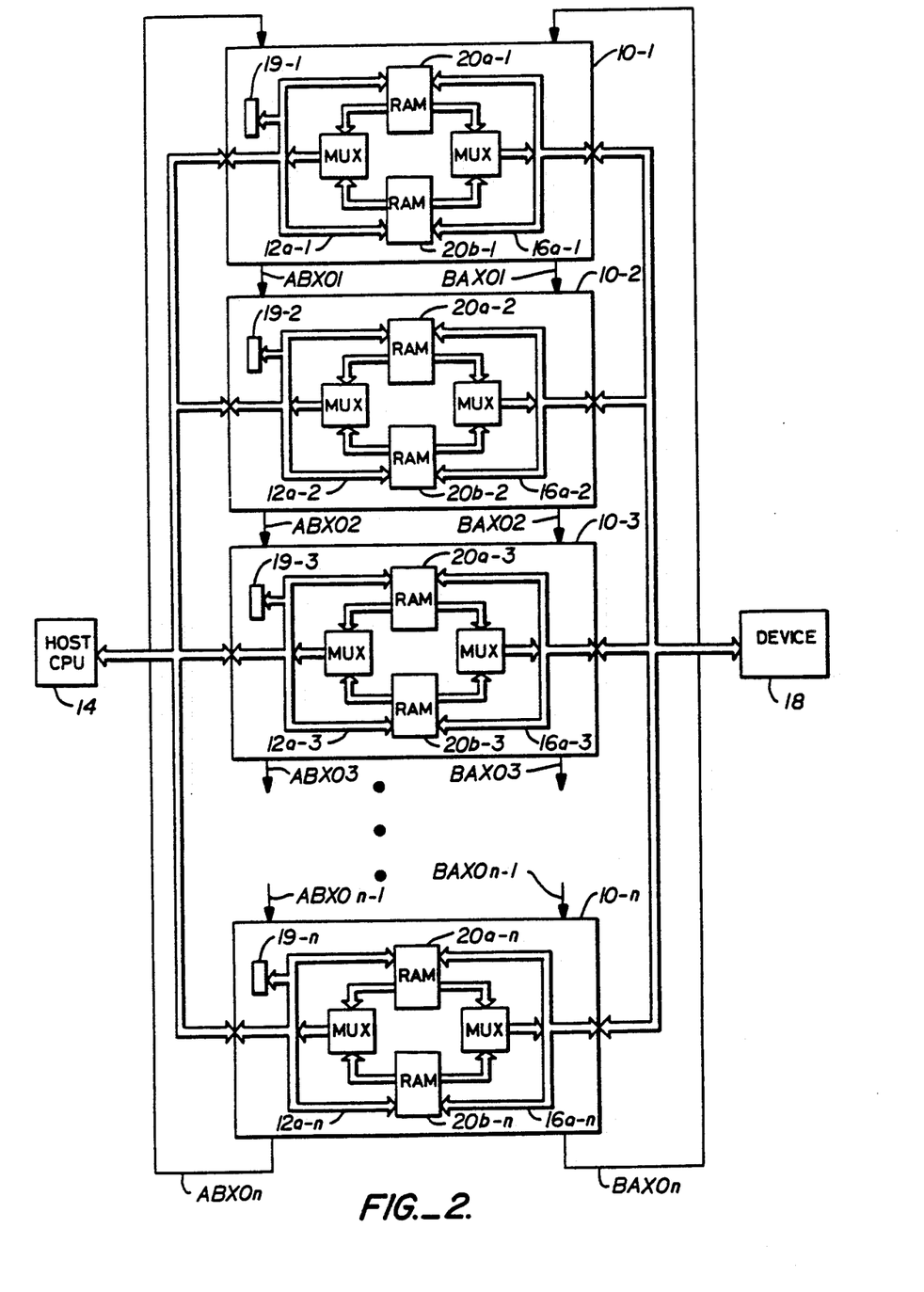
FIG. 2 is a block diagram of a plurality of memory B devices constructed in accordance with my invention constructed in accordance with my invention cascaded to provide a larger FIFO buffer.

In one embodiment, device 10 can be cascaded with one or more memory devices identical to device 10 so that the cascaded memory devices function as two nK×9 FIFO memory devices where n is the number of devices cascaded together. Referring to FIG. 2, it is seen that memory devices 10-1 to 10-n receive data from host CPU 14 and provide that data on a first-in-first-out basis to device 18. In addition, memory devices 10-1 to 10-n receive data from peripheral device 18 and provide that data on a first-in-first-out basis to host CPU 14. Memory device 10-1 provides output signals ABX01 and BAX01 to device 10-2, device 10-2 provides signals ABX02 and BAK02 to device 10-3, and so on. Device 10-n provides signals ABX0n and BAX0n to device 10-1. As described below, signals ABX01 to ABX0n and BAK01 to BAX0n determine which memory device 10-1 to 10-n stores data from host CPU 14, which memory device 10-1 to 10-n stores data from peripheral device 18, which memory device 10-1 to 10-n provides data to host CPU 14, and which memory device 10-1 to 10-n provides data to peripheral device 18.

During operation, memory devices 10-1 to 10-n are initialized by writing an appropriate word of data to control registers 19-1 to 19-n, respectively. Specifically, bit 2 of control register 19-1 is set to zero and bit 2 of control registers 19-2 to 19-n is set to one. Because of this, signals ABX01 to ABX0n and BAX01 to BAX0n are set to zero. Also, because bit 2 of control register 19-1 is set to zero, as data is provided to memory devices 10-1 to 10-n by host CPU 14, that data is stored in successive locations within RAM 20a-1 of device 10-1. When data is stored in the last location of RAM 20a-1, signal ABX01 goes high, indicating that subsequent words of data provided to memory devices 10-1 to 10-n are to be stored in RAM 20a-2 of memory device 10-2. When data is stored in the last location of RAM 20a-2, signal ABX02 goes high. Data subsequently provided by host CPU 14 is stored in RAM 20a-3 of memory device 10-3.

When peripheral device 18 receives data from devices 10-1 to 10-n, since bit 2 of control register 19-1 of device 10-1 is zero, RAM 20a-1 of device 10-1 provides that data. When data is read from the last location of RAM 20a-1, signal ABX01 goes low. When peripheral device 18 again attempts to read data from memory devices 10-1 to 10-n, that data is provided by RAM 20a-2 of device 10-2. In this way, RAMS 20a-1 to 20a-n act as a single nK×9 FIFO memory device.

Signals BAX01 to BAX0n function in a manner similar to signals ABX01 to ABX0n to control flow of information to and from RAMs 20b-1 to 20b-n.

It will be appreciated, in light of the above discussion, that FIG. 2 illustrates serially cascaded memory devices. A plurality of FIFO memory devices such as device 10 can also be connected in parallel to permit storage of wider words. For example, two memory devices can be coupled to form a first 1K×18 FIFO memory for transferring data from host CPU 14 to peripheral device 18 and a second 1K×18 FIFO memory for transferring data from peripheral device 18 to host CPU 14.

RANDOM ACCESS MEMORY ADDRESSING CIRCUIT RING COUNTERS

As mentioned above, in one embodiment, counters 24r 24w, 26r, and 26w each comprise a binary counter. In an alternative embodiment, counters 24r, 24w, 26r, and 26w each comprise a set of ring counters.

Figure 3:
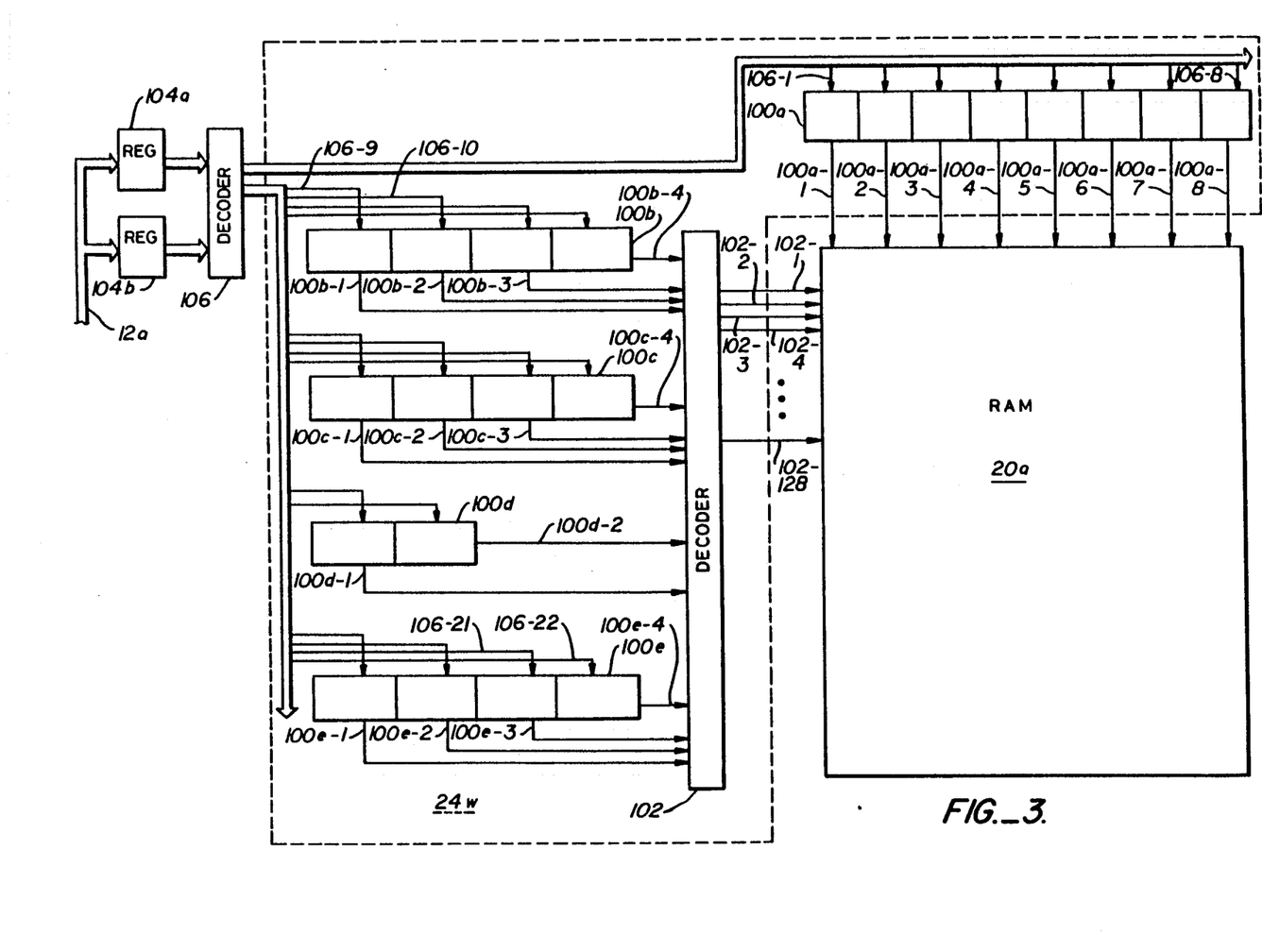
FIG. 3 is a block diagram of counter 24w which address RAM 20a of FIG. 1.

FIG. 3 is a block diagram of an embodiment of counter 24w in which counter 24w comprises a set of ring counters, it being understood that counters 24r, 26w and 26r are identical to counter 24w. As described in detail below, counter 24w actually comprises five ring counters 100a to 100e. Referring to FIG. 3, dual port RAM 20a is configured as 8 columns × 128 rows. (8 columns × 128 rows = 1,024 locations, each location storing 9 bits of data). Because of this, counter 24w must provide 136 select lines (8 column select lines + 128 row select lines=136 select lines). 8 bit ring counter 100a within counter 24w selects a column within dual port RAM 20a by raising one of the 8 output leads 100a-1 to 100a-8. A decoder 102 selects a row in response to the state of ring counters 100b to 100e. As can be seen in FIG. 3, ring counter 100b has four possible states corresponding to which one of four output leads 100b-1 to 100b-4 is in a high state. Similarly, ring counter 100c has four possible states, ring counter 100d has two possible states and ring counter 100e has four possible states. Thus, there are 128 (4×4×2×4) possible permutations of states for counters 100b to 100e, and thus, counters 100b to 100e determine which of the 128 rows within RAM 20a is selected by decoder 102. Decoder 102 receives the signals on leads 100b-1 to 100b-4, 100c-1 to 100c-4, 100d-1 to 100d-2, and 100e-1 to 100e-4, from ring counters 100b to 100e and provides a select signal on one of 128 output leads 102-1 to 102-128 in response thereto.

I have discovered that by using four ring counters 100b to 100e instead of using a single 128 bit ring counter, a circuit constructed in accordance with my invention can be formed on a smaller surface area of an integrated circuit, and is therefore less expensive to build. It will be appreciated, however, that in other embodiments, different numbers of ring counters with different numbers of stages can be used to address RAM locations.

Ring counter 100a changes state each time counter 24w addresses dual port RAM 20a. When the last output lead 100a-8 of ring counter 100a is high, the next time counter 24w addresses dual port RAM 20a, last output lead 100a-8 of counter 100a goes low, first output lead 100a-1 of ring counter 100a goes high, and ring counter 100b changes state. Similarly, ring counter 100c only changes state when last output lead 100a-8 of ring counter 100a and last output lead 100b-4 of ring counter 100b are both high. Ring counters 100d and 100e change state in a similar manner.

As mentioned above, counter 24w can store an initial value in response to a command from host CPU 14. Accordingly, the circuit of FIG. 3 includes a pair of registers 104a and 104b which receive data from host CPU 14 via data bus 12a. When data is written into registers 104a and 104b, that data is decoded by a decoder 106 which provides 8 output signals 106-1 to 106-8 to the 8 stages of ring counter 100a. Similarly, decoder 106 provides 14 output signals 106-9 to 106-22 to ring counters 100b to 100e. In this way, host CPU 14 initializes ring counters 100a to 100e, and therefore counter 24w, to any desired value.

Figures 4, 4B:
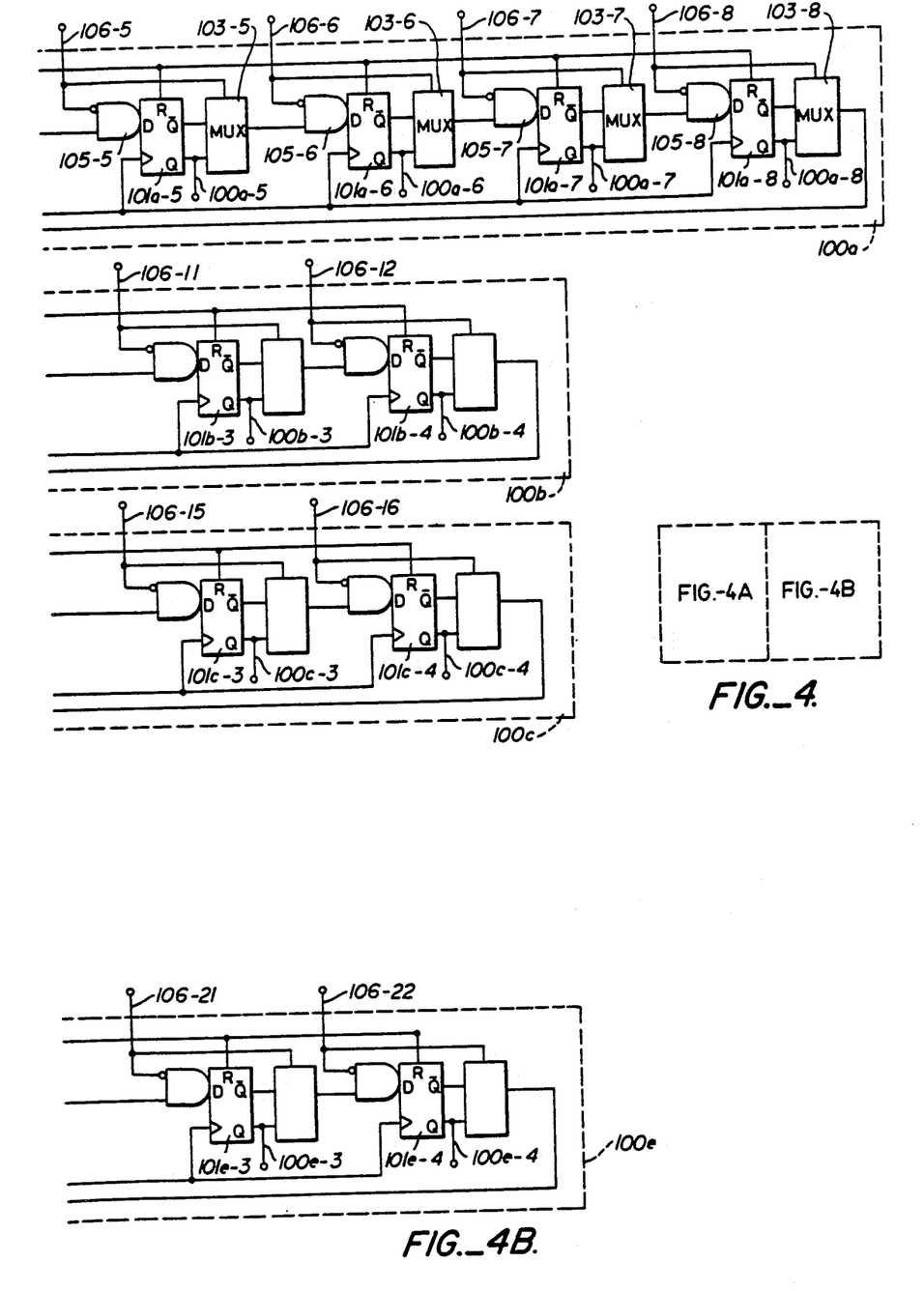
Figure 4A:
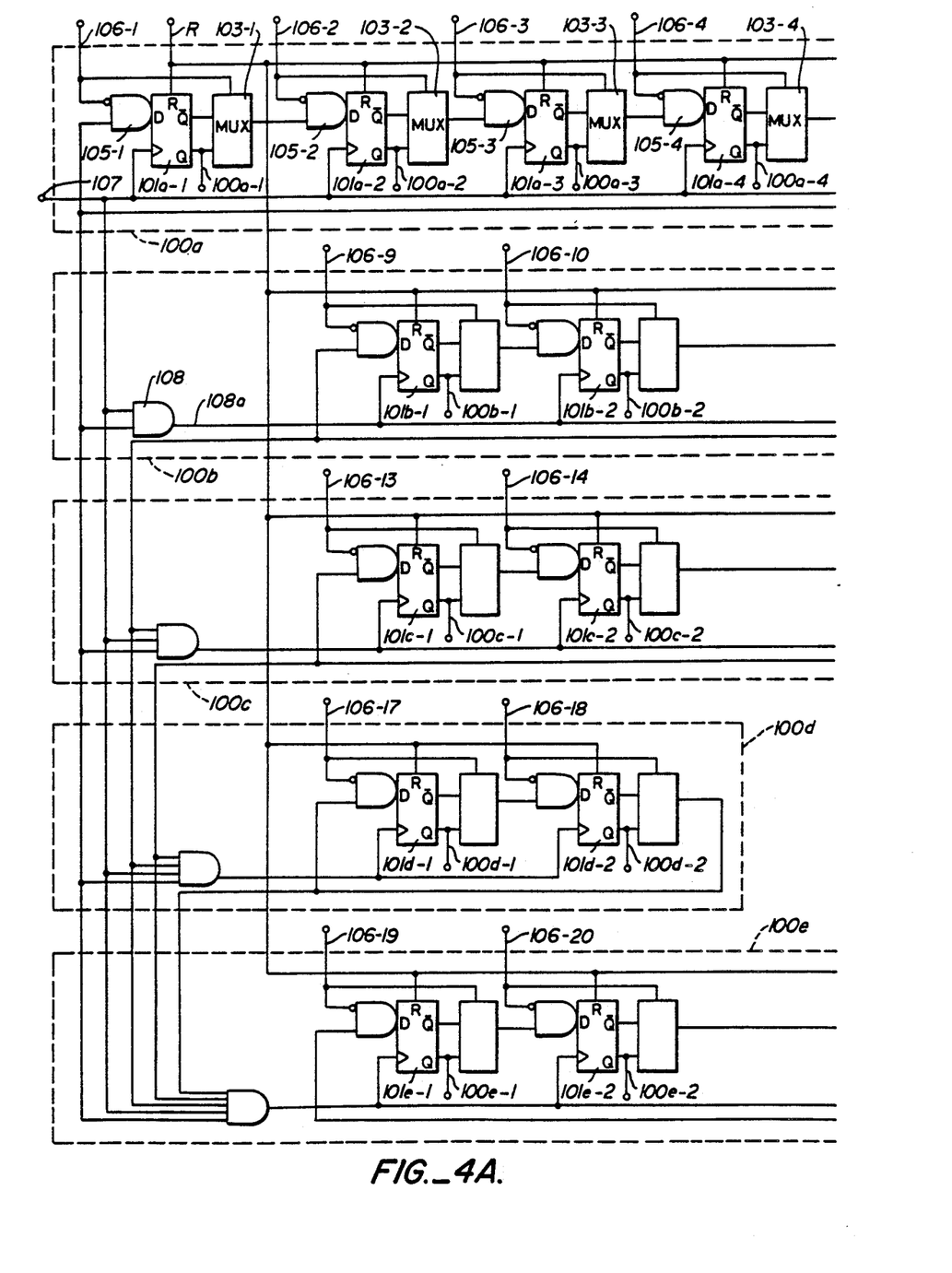

FIGS. 4a and 4b schematically illustrate ring counters 100a to 100e. As seen in FIGS. 4a and 4b ring counter 100a includes 8 flip-flops 101-1 to 101-8 which provide the column select signals on leads 100a-1 to 100a-8 for RAM 20a. The Q and Q output signals of flip-flop 100a-1 are presented to a multiplexer 103-1 which in turn is coupled to the D input lead of flip-flop 101a-2 via an AND gate 105-2. Flip-flop 101a-2 is coupled to flip-flop 101a-3 via multiplexer 103-2 and an AND gate 105-3, and so on. AND gates 105-1 to 105-8 include inverting input leads which receive signals 106-1 to 106-8, respectively, from decoder 106. In addition, multiplexers 103-1 to 103-8 also include control input leads which receive signals 106-1 to 106-8, respectively. Normally, signals 106-1 to 106-8 are all low so that the Q output signal from flip-flop 101a-1 is presented to the D input lead of flip-flop 101a-2 via multiplexer 103-1 and AND gate 105-2. Similarly, the Q output signal from flip-flop 101a-2 is presented to the D input lead of flip-flop 101a-3, etc. Each time counter 24w is used to address RAM 20a, clock input lead 107 receives a pulse which clocks flip-flops 101a-1 to 101a-8 so that the contents of flip-flop 101a-1 are stored in flip-flop 101a-2, the contents of flip-flop 101a-2 are stored in flip-flop 101a-3, and so on. In this way, each time counter 24w is used to select location within RAM 20a, a different column within RAM 20a is selected as a destination for data being written.

Flip-flops 101b-1 to 101b-4 within ring counter 100b are coupled together in the same manner as the flip-flops of ring counter 100a. However, the flip-flops 100b-1 to 100b-4 are clocked by a signal 108a provided by an AND gate 108. AND gate 108a receives the clock signal from lead 107 and the output signal from multiplexer 105-8. Thus, the flip-flops of ring counter 100b are not clocked and ring counter 100b cannot increment unless flip-flop 101a-8 stores a one.

The flip-flops of ring counter 100c are similarly arranged except that the flip-flops of ring counters 100c are not clocked unless flip-flop 101b-4 and 101a-8 store a one. In a similar manner, ring counter 100d does not increment unless flip-flops 101a-8, 101b-4 and 101c-4 store a one and ring counter 100e cannot increment unless flip-flops 101a-8, 101b-4, 101c-4 and 101d-2 store a one.

Each of the flip-flops within ring counters 100a, 100b, 100c, 100d and 100e include a reset input lead coupled to receive a reset signal R which resets all of the flip-flops within counter 24w so that their Q output signals are all one. When setting counter 24w to an initial value, reset signal R is pulsed, thereby causing each of the flip-flops within counter 24w to store a one. After that, decoder 106 (FIG. 3) provides output signals on leads 106-1 to 106-22 in order to set counter 24w to a predetermined state. For example, if it is desired to select an address within the second column of RAM 20a, signals 106-1 and 106-3 to 106-8 are brought high and signal 106-2 is brought low. Clock line 107 is then pulsed, causing flip-flops 101a-1 and 101a-3 to 101a-8 to store a zero and causing flip-flop 101a-2 to store a one. In this way, ring counter 100a is initialized to a predetermined value in order to select column 2. Ring counters 100b, 100c, 100d and 100e are initialized in a similar manner.

Although the schematic diagram of FIG. 4 illustrates leads 100a-1 to 100a-8 driven by the Q output leads of flip-flops 101a-1 to 101a-8, those skilled in the art will recognized that leads 100a-1 to 100a-8 can also be driven by multiplexers 103-1 to 103-8, respectively, instead. Leads 100b-1 to 100b-4, 100c-1 to 100c-4, 100d-1, 100d-2, and 100e-1 to 100e-4 can be driven by associated multiplexers within ring counters 100b, 100c, 100d and 100e as well.

Figure 5:
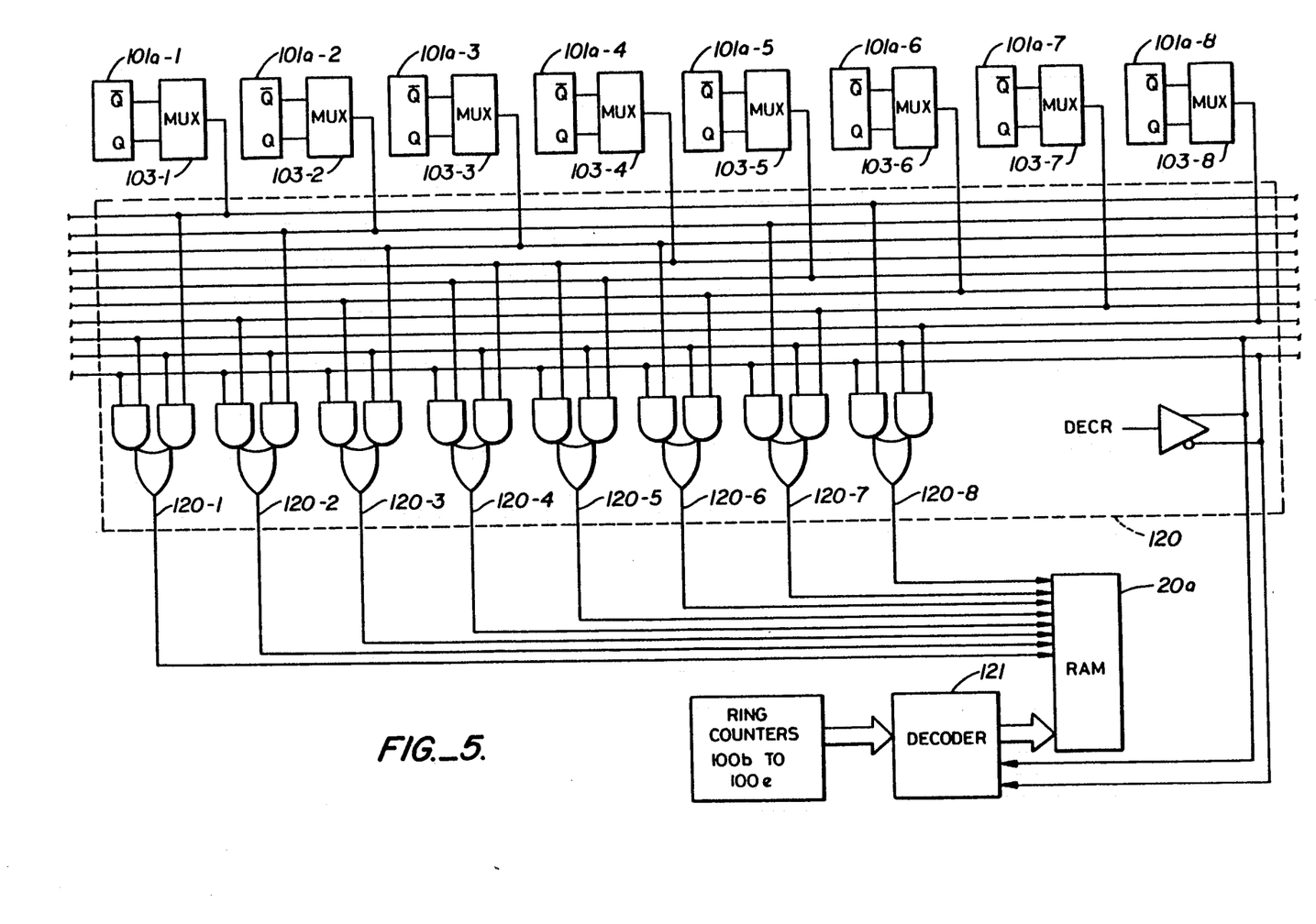
FIG. 5 schematically illustrates a decoder used in one embodiment of my invention for causing counter 24w of FIGS. 3 and 4 to selectively increment or decrement.

In an alternate embodiment of my invention, it is desirable to be able to program counters 24r, 24w, 26r and 26w to increment or decrement, thereby permitting one to use memory device 10 as either a FIFO memory or a LIFO memory. Accordingly, referring to FIG. 5, the Q output leads of flip-flops 101a-1 to 101a-8 are presented to a logic circuit 120 via multiplexers 103-1 to 103-8, respectively. Logic circuit 120 also receives an input control signal DECR. In this alternative embodiment, logic circuit 120 provides output signals on leads 120-1 to 120-8, which select one of the eight columns within RAM 20a instead of the signals on leads 100a-1 to 100a-8. When signal DECR is high, circuit 120 selects successively increasing rows within RAM 20a in response to the output signals from ring counter 100a. When signal DECR is low, logic circuit 120 selects successively decreasing rows within RAM 20a. In this way, counter 24w constructed in accordance with this alternate embodiment of my invention can be programmed to act as an up counter or a down counter, depending on the state of signal DECR. A decoder 121 similar to decoder 120 is connected to ring counters 100b to 100e and selects successively increasing or decreasing rows in response to signal DECR. Signal DECR is controlled by host CPU 14.

In another embodiment, instead of using one ring counter to select a column within RAM 20a and a plurality of ring counters to select a row within RAM 20a, a plurality of ring counters are used to select a column within RAM 20a and a single ring counter selects a row within the RAM 20a. In yet another embodiment, a plurality of ring counters are used to select a row and a plurality of ring counters select a column.

While the invention has been described with regards to specific embodiments, those skilled in the art will recognize that changes can be made in form and detail without departing from the spirit and scope of the invention. For example, instead of using 1K×9 dual port RAMs, RAMs 20a and 20b could have different numbers of locations and different word widths. In addition, memory device 10 could be constructed using MOS or bipolar technologies. Accordingly, all such changes come within the scope of the present invention.

I claim:

1. A memory device comprising:
   first data storage means having n locations for storing n words of data, where n is an integer greater than one;
   second data storage means having m locations for storing m words of data, where m is an integer greater than one; and
   control means for functioning in one of a first mode and a second mode, said control means receiving a first set of words of data and storing said first set of words of data in sequential locations within said first data storage means when said control means is in said first mode, said control means receiving a second set of words of data and storing said second set of words of data in sequential locations within said second data storage means when said control means is in said first mode, said control means providing data stored in said sequential locations within said first and second data storage means, thereby causing said first and second data storage means to function as an n location FIFO memory and an m location FIFO memory, respectively, when said control means is in said first mode, said control means storing a third set of words of data in sequential locations within said first data storage means and then storing words of data within said third set in sequential locations within said second data storage means after storing data in the last location in said first data storage means when said control means is in said second mode, said control means providing data stored in sequential locations within said first data storage means and then providing data stored in sequential locations within said second data storage means after providing data stored in the last location of said first data storage means when said control means is in said second mode, thereby causing said first and second data storage means to function as a single n+m location FIFO memory.

2. The memory device of claim 1 wherein said first data storage means is a first RAM and said second data storage means is a second RAM, and said control means comprises:
   a first counter for providing sequential addresses to said first RAM;
   a first data bus for providing data to said first RAM, said control means storing data from said first data bus in locations within said first RAM selected by said first counter;
   a second data bus; and
   a second counter for providing sequential addresses to said second RAM, said control means storing data from said second data bus in locations within said second RAM selected by said second counter when said control means is in said first mode, said control means storing data from said first data bus in locations within said second RAM selected by said second counter after data from said first data bus is stored in the last location of said first RAM when said control means is in said second mode.

3. The memory device of claim 2 further comprising:
   a third counter for providing sequential addresses to said first RAM, said control means providing data stored in locations within said first RAM selected by said third counter on said second data bus; and
   a fourth counter for providing sequential addresses to said second RAM, said control means providing data stored in locations within said second RAM selected by said fourth counter on said first data bus when said control means is in said first mode, said control means providing data stored in locations within said second RAM selected by said fourth counter on said second data bus after data from the last location in said first RAM is provided on said second data bus when said control means is in said second mode.

4. The memory device of claim 3 further comprising:
   a first port coupled to said first data bus for receiving data from and providing data to a first device;
   a second port coupled to said second data bus for receiving data from and providing data to a second device, whereby when said control means is in said first mode, said memory device receives said first set of words of data from said first device and provides said first set of words of data on a first-in-first-out basis to said second device when said control means is in said first mode, said memory device receiving said second set of words of data from said second device and providing said second set of words of data to said first device when said control means is in said first mode, said memory device receiving said third set of words of data from said first device and providing said third set of words of data to said second device on a first-in-first-out basis when said control means is in said second mode.

5. The memory device of claim 4 further comprising means for receiving an address from said first device, said memory device providing data from a location within said first or second RAM, said location being determined by said received address, said memory device also storing data from said first device in a location within said first or second RAM, said location being determined by said received address, so that said first device can receive data from or store data in a desired location within said first and second RAMs regardless of the contents of said first, second, third and fourth counters.

6. The memory device of claim 4 further comprising:
a first flag register for receiving data from said first device, said memory device selectively providing a first signal to said first device when the contents of said first counter equal the contents of said first flag register;
a first end of count register for selectively providing a first end of count signal to said first device when the contents of said first end of count register equal the contents of said first counter; and
wherein said first counter can be preset to an initial value selected by said first device, thereby permitting said memory device to load a predetermined block of locations within said first RAM with data from said first device.

7. The memory device of claim 6 further comprising:
second, third and fourth flag registers for receiving data from said first device, said memory device selectively providing second, third, and fourth output signals when the contents of said second, third and fourth counters equal the contents of said second, third and fourth flag registers, respectively; and
second, third and fourth end of count registers for receiving data from said first device, said memory device providing second, third, and fourth end of count signals when the contents of said second, third and fourth counters equal the contents of said second, third and fourth end of count registers, respectively,
and wherein said second, third, and fourth counters can be preset to initial values selected by said first device.

8. A memory device comprising:
first data storage means having n locations for storing n words of data, where n is an integer greater than one;
second data storage means having m locations for storing m words of data, where m is an integer greater than one; and
control means for functioning in one of a first mode and a second mode, said control means receiving a first set of words of data and storing said first set of words of data in sequential locations within said first data storage means when said control means is in said first mode, said control means receiving a second set of words of data and storing said second set of words of data in sequential locations within said second data storage means when said control means is in said first mode, said control means providing data stored in said sequential locations within said first and second data storage means, thereby causing said first and second data storage means to function as an n location last-in-first-out memory and an m location last-in-first-out memory, respectively, when said control means is in said first mode, said control means storing a third set of words of data in sequential locations within said first data storage means and then storing words of data within said third set in sequential locations within said second data storage means after storing data in the last location in said first data storage means when said control means is in said second mode, said control means providing data stored in sequential locations within said first and second data storage means on a last-in-first-out basis when said control means is in said second mode, thereby causing said first and second data storage means to function as a single $n+m$ location last-in-first-out memory.

* * * * *